METHOD OF FORMING A CRYSTALLINE SEMICONDUCTOR LAYER ON AN ALUMINA SUBSTRATE

Filed Nov. 29, 1965 2 Sheets-Sheet 1

INVENTORS
PAUL H. ROBINSON &
DAVID J. DUMIN
BY [signature]
Attorney

INVENTORS
PAUL H. ROBINSON &
DAVID J. DUMIN
BY [signature]
Attorney

United States Patent Office 3,413,145
Patented Nov. 26, 1968

3,413,145

METHOD OF FORMING A CRYSTALLINE SEMICONDUCTOR LAYER ON AN ALUMINA SUBSTRATE

Paul H. Robinson, Trenton, N.J., and David J. Dumin, New York, N.Y., assignors to Radio Corporation of America, a corporation of Delaware

Filed Nov. 29, 1965, Ser. No. 510,309
4 Claims. (Cl. 117—201)

ABSTRACT OF THE DISCLOSURE

An improved method of forming a monocrystalline silicon layer on a monocrystalline alumina substrate includes the steps of depositing a layer of single crystalline silicon onto an alumina substrate, heating the combination to arrange the atoms of the silicon layer in a more perfect crystalline structure, and slowly cooling the combination.

This invention relates to an improved method of depositing a crystalline semiconductor layer on an insulating substrate. The invention also relates to an improved method of fabricating a semiconductive device wherein improved conductivity type regions are formed within a monocrystalline semiconductor silicon layer deposited on a crystalline alumina substrate.

It has been found that prior art methods of depositing a monocrystalline semiconductor layer on a crystalline alumina substrate provide a semiconductor layer having a large number of crystalline imperfections. Because of the crystalline imperfections, it is difficult to diffuse impurities uniformly into the semiconductor layer. Consequently, with semiconductor layers deposited on alumina substrates in accordance with prior art techniques, it is sometimes difficult to achieve a sharp, well defined boundary between the diffused region or belt and the remainder of the semiconductor layer, although it is this structure that is preferred for thin film transistors as well as for solar cells.

Accordingly, it is an object of this invention to provide an improved method of depositing onto an insulating substrate a monocrystalline semiconductor layer into which impurities can be controllably diffused.

Another object of this invention is to provide an improved method of fabricating a semiconductive device whereby discrete conductivity type regions are formed within a monocrystalline semiconductor silicon layer deposited on a crystalline alumina substrate.

Briefly, the improved method described herein includes the steps of depositing a layer of single crystalline silicon onto an alumina substrate, and then heating the substrate in an ambient which is nonreactive with the layer to arrange the atoms of the silicon layer in a more perfect crystalline structure. Since the crystalline structure of the silicon layer is improved, conductivity type determining impurities may be diffused into the layer with a greater degree of controllability.

Figures 1, 3:
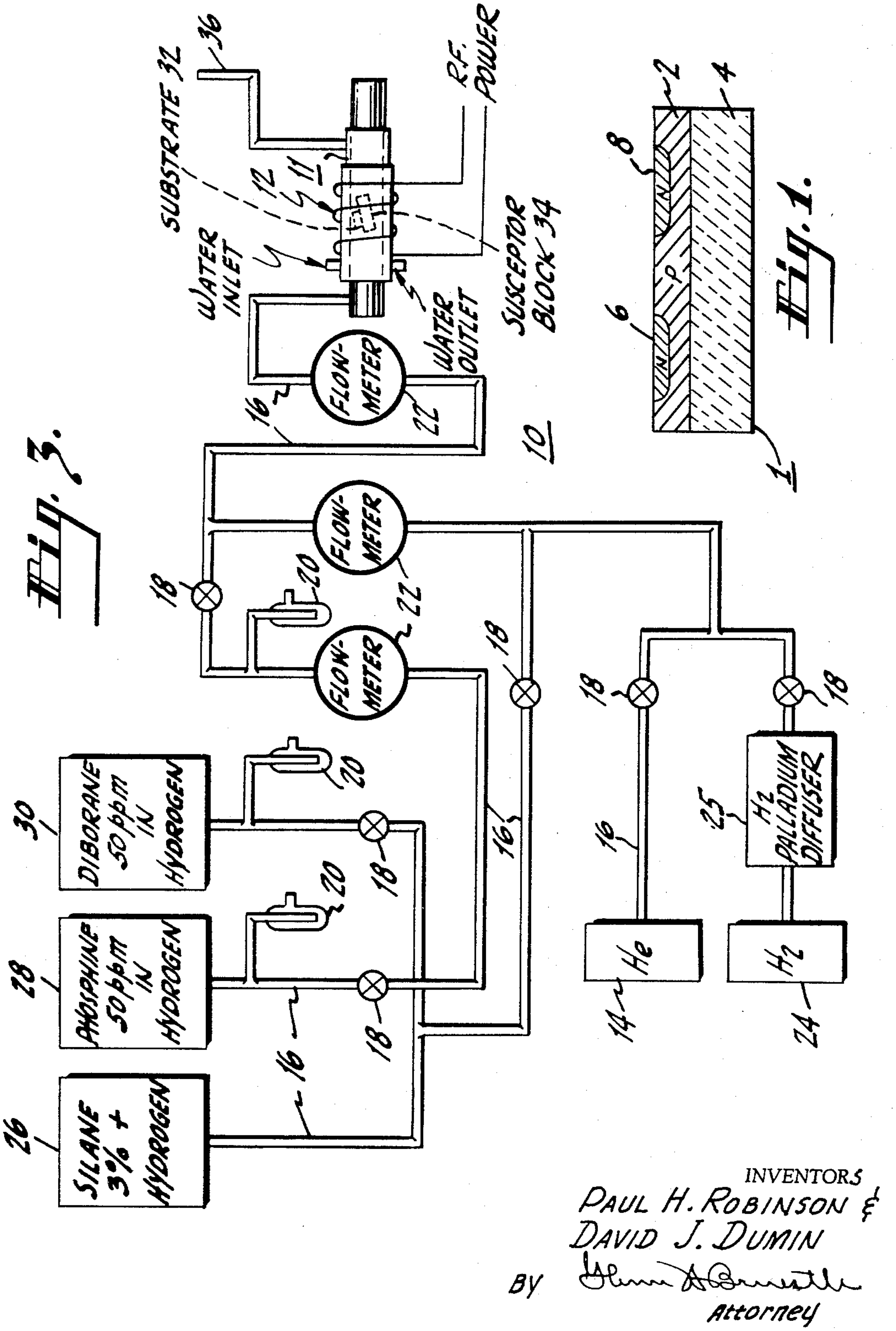
FIGURE 1 is a cross sectional view of a silicon-on-sapphire device, and illustrates discrete conductivity type regions diffused therein.
FIGURE 3 is a schematic diagram of apparatus useful in the practice of the method of FIGURE 1.

Illustrated in FIGURE 1 is a semiconductor device 1 having a monocrystalline silicon layer 2 deposited onto a sapphire substrate 4 by the improved method to be described with reference to FIGURE 2. This method provides a silicon-on-sapphire device wherein the silicon layer has a more perfect crystalline structure than heretofore found in the prior art. Because of the crystalline perfection of the monocrystalline silicon layer 2, discrete sharply defined conductivity type regions 6 and 8 may be formed therein using prior art diffusion techniques.

Figure 2:
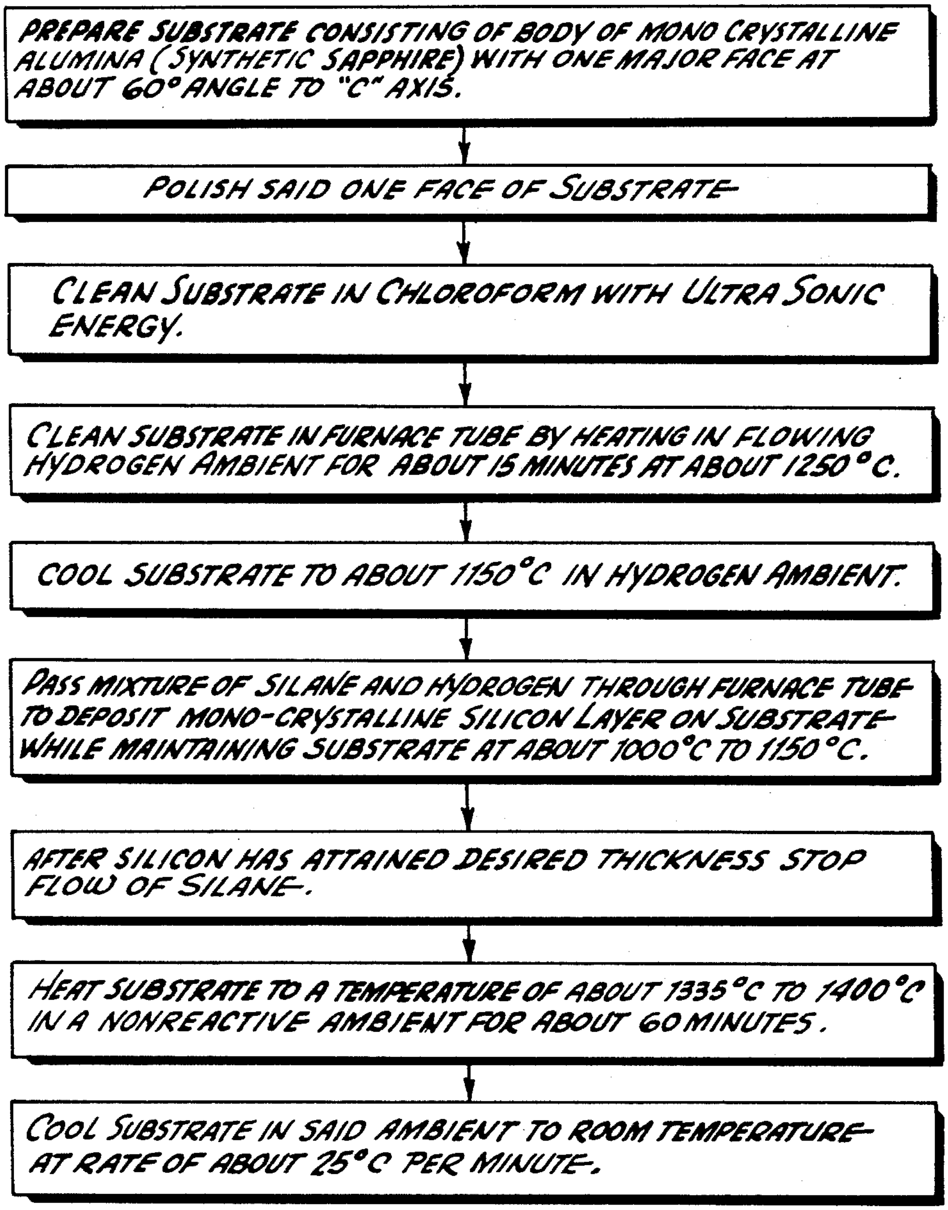
FIGURE 2 is a flow chart of one embodiment of the improved method of depositing a monocrystalline semiconductive layer on an alumina substrate.

In accordance with the method described in FIGURE 2, a body of monocrystalline alumina is prepared as an insulating substrate. Crystalline alumina occurs naturally as the mineral corundum. Transparent varieties of corundum are gems such as ruby and sapphire. The different varieties of corundum exhibit different colors due to small amounts of different impurities within the respective varieties. Clear varieties of synthetic monocrystalline alumina are now commercially available, and are also known as sapphire and ruby. In this example, the substrate utilized is a body of water-white synthetic monocrystalline alumina, such as that sold commercially by Linde Company Crystal Products Division as "sapphire." The exact size and shape of the body are not critical. In this example, the sapphire body is a disc about 0.020 inch thick and 0.375 inch in diameter.

Monocrystalline alumina forms a lattice defined by four crystal axes, known as the $a_1$, $a_2$, $a_3$, and $c$ axes. It has been found advantageous to cut the sapphire disc with the major faces of the disc at an angle of about 60° to the $c$ axis of the crystal lattice so that a $22\bar{4}3$ crystal face is exposed. While the exact mechanism for the improved result thus obtained is not certain, it is known that when sections of a hexagonal crystal are made in different ways, the spacing and density of the crystal atoms in the exposed crystal face will vary. By cutting and lapping a major face of the sapphire disc at a 60° angle to the $c$ axis to expose a $22\bar{4}3$ crystal face, the spacing of atoms in this exposed crystal face becomes close to the spacing of atoms in monocrystalline silicon. It is presently believed that this close match in lattice distance produces the best monocrystalline layers.

One major face of the sapphire disc is polished to a high degree of smoothness. A smooth surface is important since the silicon subsequently deposited tends to collect preferentially on any scratches or irregularities on the surface of the substrate.

Advantageously, after one face of the sapphire disc has been polished, the disc is degreased by cleaning it with ultrasonic energy in an organic solvent such as chloroform or the like.

Following preparation of the sapphire disc as described above, apparatus 10, as illustrated in FIGURE 3, may be used in the further processing thereof.

Apparatus 10 comprises a water-cooled quartz furnace tube 11 provided with an RF heating coil 12. A helium tank 14 is connected to the furnace tube 11 by a system of quartz lines 16 suitably equipped with valves 18, liquid traps 20, and flow meters 22. Hydrogen source 24 is similarly connected to furnace tube 11. Before reaching the furnace tube, the hydrogen is purified by passing it through a palladium diffuser 25.

Gas tanks 26, 28, and 30 are also connected to furnace tube 11 by quartz lines 16. Tank 26 contains a mixture of hydrogen and about 1 to 5 volume percent silane. In this example, tank 26 contains a mixture of 97 volume percent hydrogen and 3 volume percent silane. Tank 28 contains a mixture of hydrogen and a gas which induces N type conductivity in silicon. In this example, tank 28 contains hydrogen with about 50 parts per million phosphine. Tank 30 contains a mixture of hydrogen and a gas which induces P type conductivity in silicon. In this example, tank 30 contains hydrogen with about 50 parts per million diborane.

A polished sapphire substrate 32 (FIGURE 3) is positioned in the water-cooled furnace tube 11 on a silicon susceptor block 34 with the polished face of the substrate 32 uppermost. The apparatus 10 is flushed first with helium from tank 14, then with hydrogen from tank 24. The substrate is next heated in an ambient of flowing hydrogen for about 15 minutes at about 1250° C. This step effectively cleans the surface of the sapphire substrate. The substrate is then cooled to about 1150° C. while maintaining the flow of hydrogen. Block 34 is kept at about 1000° C. to 1150° C.

The silane-hydrogen mixture from tank 26 is now passed into the furnace tube 11. Pure silane tends to decompose with explosive violence when exposed to oxygen, but silane diluted with hydrogen decomposes smoothly to form hydrogen and elemental silicon. The former passes out of furnace tube 11 through the gas exit 36, while some of the latter deposits on the polished face of sapphire disc 32 as a monocrystalline layer. The rate of deposit of the silicon layer varies with: (1) the concentration of silane in the mixture, (2) the rate of flow of the mixture, and (3) the temperature in the furnace.

After the monocrystalline silicon layer has attained the desired thickness, which may, for example, be in the range of about 1 to 50 microns, the flow of the silane-hydrogen mixture from tank 26 is terminated. Then, without removing the substrate 32 from the furnace tube 11, it is heated to a temperature of about 1335° C. to 1400° C. in an ambient which does not react with the silicon. For example, an ambient of hydrogen or an inert gas may be used. This temperature is maintained for about 60 minutes. Care must be taken not to exceed 1425° C., the melting point of the monocrystalline silicon layer. It has been found that the thermal energy imparted to the substrate by this last step causes atoms in the monocrystalline silicon layer to rearrange themselves to form a more perfect crystalline structure. Photomicrographs of the crystal structure have revealed that the number of imperfections decreases significantly, however the improved crystalline structure begins to occur when the annealing process takes place at a temperature about 1250° C. The preferred temperature is about 1335° C. to 1400° C. Advantageously, the sapphire substrate 32 is cooled to room temperature in the hydrogen or inert ambient. For best results, a cooling rate of about 25° C. per minute is preferred.

Silicon layers thus deposited on the polished face of the sapphire substrate have been found to be free of grain boundaries, and to possess better single crystal quality throughout than silicon layers deposited on sapphire substrates in accordance with prior art methods. The crystalline structure of the monocrystalline silicon layer is an important consideration, because as the crystalline structure becomes more nearly perfect, the diffusing of impurities into the layer becomes more controllable.

The silicon layer formed as described in the above example is uniformly of P type conductivity. However, if it is desired to deposit a P type monocrystalline silicon layer with lower resistivity than that provided in the above example, the method described above may be followed with the addition of an acceptor. When the silane-hydrogen mixture from tank 26 is flowing into the furnace tube 11, the valve on tank 30 is opened so that some of the diborane-hydrogen mixture also enters furnace tube 11. As a result, the silicon layer deposited on the sapphire substrate contains some boron atoms, thereby increasing the concentration of holes (positive charge carriers) in the silicon layer, and decreasing the electrical resistivity of the layer. The level of boron doping in the silicon layer may be varied as desired by monitoring the amount of diborane-hydrogen mixture flowing into furnace tube 11.

If desired, N type monocrystalline silicon layers may be deposited instead of P type layers. The method described in Example I is generally suitable for this purpose, with one change. When the silane-hydrogen mixture from tank 26 is flowing into furnace tube 11, the valve on tank 28 is opened, so that some of the phosphine-hydrogen mixture also enters the furnace tube 11. The silicon layer thus deposited on the sapphire substrate contains sufficient phosphorus atoms to be of N type conductivity. The concentration of phosphorus atoms in the silicon layer, hence the negative charge carrier (electron) concentration, and the electrical resistivity of the layer, may be varied as desired by controlling the amount of the phosphine-hydrogen mixture which is passed into furnace tube 11.

After a silicon layer has been deposited on a sapphire substrate in the manner described above, discrete regions may then be formed in the silicon layer by prior art diffusion techniques. The diffused regions may be of the same type conductivity as the silicon layer, in which case the regions are more heavily doped. Alternately, the diffused regions may be of conductivity type which is opposite that of the remainder of the silicon layer.

A satisfactory method which has been used for diffusing discrete regions within the silicon layer involves growing or depositing an oxide film onto the entire surface of the silicon layer opposite the sapphire substrate, and removing portions of the oxide film by conventional photoresist techniques to expose certain portions of the surface of the semiconductive layer. A conductivity type determining impurity is then diffused into the silicon layer through the exposed surface portions. By controlling the temperature of the semiconductive layer and the time of diffusion, the regions may be diffused to a desired depth within the silicon layer. The regions diffused by these prior art methods have sharp, well defined boundaries as revealed by photomicrographs and as illustrated in FIGURE 1.

What we claim is:

1. A method of depositing a crystalline semiconductive layer on an insulating substrate, comprising:
   (a) depositing a layer of single crystalline silicon onto a monocrystalline alumina substrate by heating said substrate to about 1150° C. in a silane-containing ambient, and
   (b) heating said silicon-coated substrate in an ambient which is nonreactive with said layer to a temperature about 1250° C., whereby the atoms of said silicon layer are arranged to form a more perfect crystalline structure.

2. The method as defined in claim 1, wherein said nonreactive ambient is hydrogen.

3. The method as defined in claim 1 further including the step of cooling said substrate at a rate of about 25° C. per minute.

4. A method of fabricating a semiconductive device, comprising:
   (a) depositing a layer of single crystalline silicon onto a monocrystalline alumina substrate by heating said substrate to about 1150° C. in a silane-containing ambient,
   (b) heating said silicon-coated substrate in an ambient which is nonreactive with said layer to a temperature of about 1335° C. to 1400° C. and maintaining said substrate at said temperature for about 60 minutes, whereby the atoms of said silicon layer are arranged to form a more perfect crystalline structure, and
   (c) forming a region within said single crystalline silicon layer by diffusing a conductivity type determining impurity therein.

References Cited

UNITED STATES PATENTS

| | | | |
|---|---|---|---|
| 2,943,007 | 6/1960 | Walker et al. | 148—1.6 XR |
| 2,992,903 | 7/1961 | Imber | 148—1.6 XR |
| 3,172,791 | 3/1965 | Allegretti | 148—175 |
| 3,177,100 | 4/1965 | Mayer et al. | 148—1.6 XR |
| 3,218,204 | 11/1965 | Ruehrwein | 148—175 |

WILLIAM L. JARVIS, *Primary Examiner.*